Figure 1:
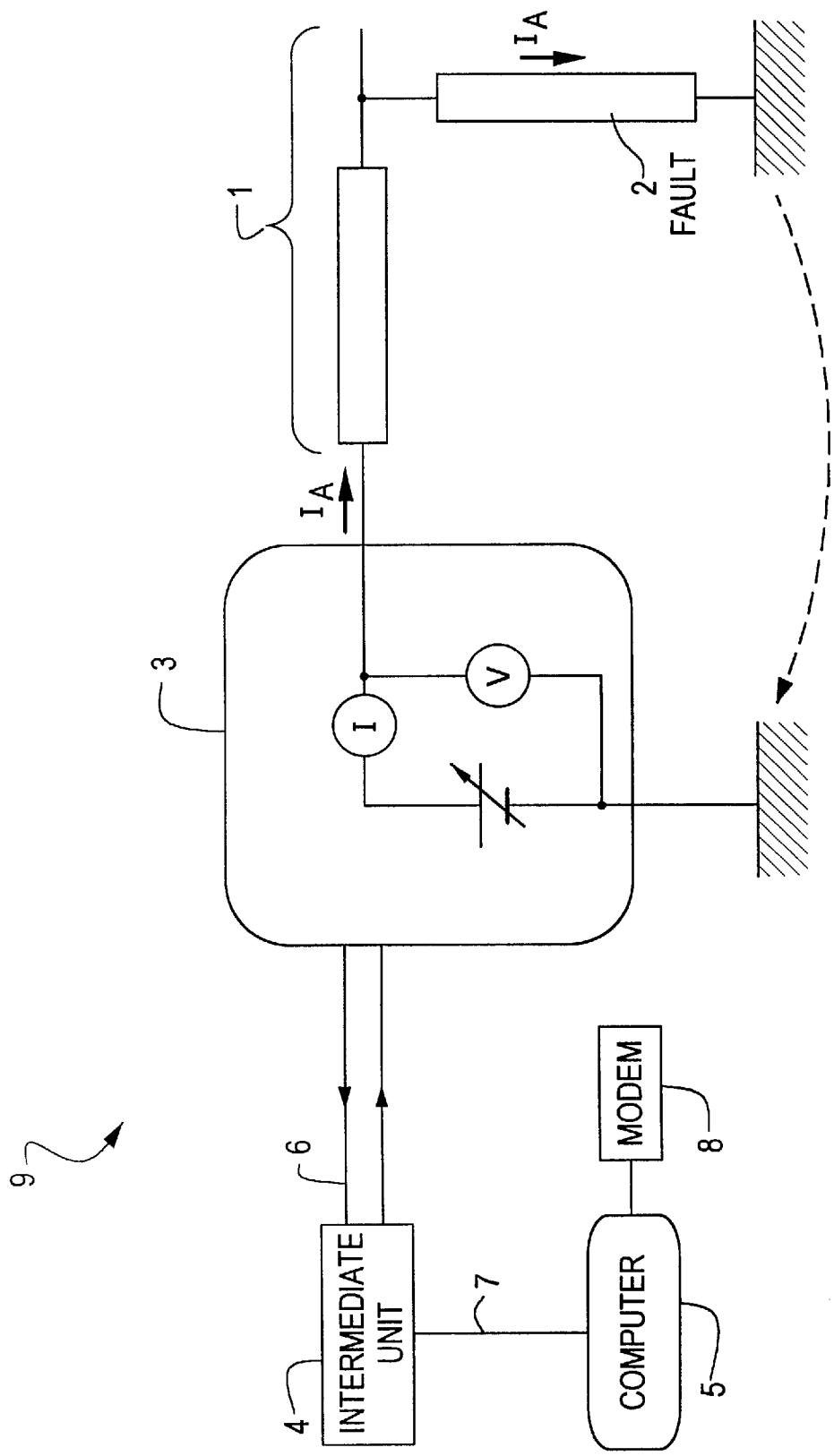

United States Patent [19]
Broyde et al.

[11] Patent Number: 5,883,517
[45] Date of Patent: Mar. 16, 1999

[54] DEVICE FOR LOCATING DEFECTS IN UNDERWATER TELECOMMUNICATION LINKS

[75] Inventors: Frederic Broyde; Evelyne Clavelier, both of Maule, France

[73] Assignee: Excem, Maule, France

[21] Appl. No.: 849,505

[22] PCT Filed: Nov. 3, 1995

[86] PCT No.: PCT/FR95/01445

§ 371 Date: Jun. 5, 1997

§ 102(e) Date: Jun. 5, 1997

[87] PCT Pub. No.: WO96/18111

PCT Pub. Date: Jun. 13, 1996

[30] Foreign Application Priority Data

Dec. 5, 1994 [FR] France .................................. 94/14689

[51] Int. Cl.[6] .................................................. G01R 31/08
[52] U.S. Cl. ........................................ 324/522; 324/525
[58] Field of Search .................... 324/512, 522, 324/523, 525, 527

[56] References Cited

U.S. PATENT DOCUMENTS 4,929,900  5/1990  Hastings et al. ...................... 324/525
5,210,498  5/1993  Paananen ............................. 324/529

FOREIGN PATENT DOCUMENTS 0230801   8/1987  European Pat. Off. .
0241416  10/1987  European Pat. Off. .
0448293   9/1991  European Pat. Off. .

*Primary Examiner*—Glenn W. Brown
*Attorney, Agent, or Firm*—Weingarten, Schurgin, Gagnebin & Hayes LLP

[57] ABSTRACT

The invention relates to an apparatus for locating faults on subsea telecommunications links by determining the resistance of a conductor of the cable having a fault not being insulated from the sea. The apparatus is provided with two terminals, one for connection to one of the conductors of the subsea link and the other for being connected to the sea or to ground, through which terminals it is capable of delivering or receiving electrical power. The apparatus, on its own or together with another apparatus of the invention, is capable of automatically performing current and voltage measurements and it is capable of processing them automatically while making use of data from one or more databases concerning notably the resistance per unit length of the cable in order to locate the fault.

24 Claims, 3 Drawing Sheets

DEVICE FOR LOCATING DEFECTS IN UNDERWATER TELECOMMUNICATION LINKS

The invention relates to an apparatus for locating faults on subsea telecommunications links that may be constituted, for example, by optical fiber cables or by coaxial cables, with fault location being done by determining the resistance of a conductor of the cable presenting a fault, in association with defective insulation relative to the sea.

The basic element of a subsea telecommunications link is a subsea cable. There are two main categories of subsea telecommunications link: coaxial cable links, and optical fiber cable links. Coaxial cable links generally use analog transmission, whereas optical fiber links generally use digital transmission.

When it is desired that an analog subsea link (i.e. a link implementing analog transmission) should cover a great distance, it normally comprises a plurality of cable sections interconnected by repeaters which are active devices whose main function is to amplify the signal so as to compensate for attenuation of the analog signal due to propagation of the signal along the cable sections.

When it is desired that a digital subsea link (i.e. implementing digital transmission) should cover a great distance, it normally comprises a plurality of cable sections interconnected by regenerators or repeaters. The role of regenerators is to reconstitute as faithfully as possible the digital information transmitted by a signal after it has been attenuated, deformed, and disturbed by travelling along a transmission cable.

For example, digital subsea links of great length, having optical fiber cables operating at 560 Mbit/s, may be implemented with regenerators, while faster links (specifically 5 Gbit/s) may be designed to have repeaters including optical amplifiers.

Subsea links may be complex in structure, having a main trunk, plus one or more branches connected to the trunk by branching units. Under such circumstances, the link includes more than two landing points.

Coaxial subsea telecommunications cables, which are normally used solely for analog subsea links, typically comprise, from the inside towards the outside: a composite conductor constituted by a steel wire core and a copper tube; an insulating sheath of polyethylene; an outer conductor formed by a strip of copper or aluminum; and an insulating sheath of polyethylene. Additional layers may be added to provide the cable with mechanical protection.

Subsea optical fiber cables which are normally used solely for digital subsea links, typically comprise, from the inside towards the outside: an optical unit containing optical fibers; a composite conductor surrounding the optical unit and comprising armoring of steel wires that provide the cable with mechanical strength in traction, and a copper tube surrounding the armoring; and an insulating sheath of polyethylene. Additional layers may be added to provide the cable with mechanical protection.

For a link using regenerators or repeaters, electrical power is generally fed to such active apparatuses by injecting current into a conductor of the cable, with the various active apparatuses being fed in series by a process that is well known to the person skilled in the art, who refer to "remote power feeding". For example, both for a coaxial subsea telecommunications cable and for a subsea optical fiber cable as described above, remote power feeding for the link is generally provided via the composite conductor.

For a subsea optical fiber cable of this kind, the go power current travels along the composite conductor while the return current travels through seawater and optionally through the ground, with the remote power feeding equipment (PFE) delivering the remote electrical power being appropriately grounded by a grounding contact in the earth or by a grounding contact in the sea. These equipment are generally installed on land, close to the landing points of the link.

For a subsea coaxial cable, the outer conductor is normally grounded at the ends of the link, and the remote power feeding takes place in a manner similar to that used for an optical fiber cable, with the return current now being split between the outer conductor and seawater and/or ground.

No distinction is made herein between "grounding to the sea" and "grounding to earth".

Methods of locating all kinds of faults that appear on subsea links have been in existence for a long time and are well known to the person skilled in the art. By way of example, mention may be made of the following:

Fault localization methods that operate by measuring DC resistance. Such methods have been in use since telegraph cables. They assume that a conductor which is normally insulated from the sea is put into contact with the sea at the location of the fault. Such methods rely on determining from one end of the link the resistance that appears along the conductor that is normally insulated, between the end of said conductor where the measurement is being made and the location of the fault.

The method of locating a fault by measuring the capacitance of the link cable: such measurements are appropriate only if the link is cut and insulated.

The impedance/frequency method: this method is used on subsea coaxial cables. The impedance of a cable varies with frequency, so it is possible to establish a relationship between the distance to a fault and variation in the impedance of a section of cable as a function of frequency. In practice, apparatus including an oscillator is present within each repeater, and serves to perform measurement on the faulty section.

The audiofrequency AC measurement method: a 25 Hz signal is applied to the electrical path and a ship searches for the resulting sound signal by means of an acoustic pickup; the fault is located by the change in the acoustic signal.

Echo ranging methods in which an electrical signal is generated and the propagation time of the reflected signal is analyzed. Localization is performed by measuring the propagation time of the signal which is assumed to be reflected at the fault; this method is used on subsea coaxial cables and it is applicable only to faults that appear before the first repeater, and to other special cases.

The reflectometry methods which comprise generating an optical signal and analyzing the propagation time of the reflected signal. Localization is performed by measuring the propagation time of the signal which is assumed to be reflected at the fault. This method is used on optical fiber cables, and is restricted mainly to faults that appear before the first regenerator or repeater, and to other special cases.

The advantages and drawbacks of the various existing methods for locating faults are well known to the person skilled in the art. On optical fiber subsea links that have already been installed, and as a general rule, only the methods of fault location by measuring DC resistance and by measuring cable capacitance can be applied on faults that occur beyond a first repeater or regenerator. These methods also have the advantage of being equally applicable to optical fiber links and to coaxial cable links, even when remote power feeding cannot be applied to the repeaters or the regenerators because of a fault.

Nevertheless, insulation faults to which the cable capacitance measurement method is applicable are not very frequent.

It should be observed that a crucial point of localization methods relying on measuring the resistance of the link using DC is that contact must exist between seawater and a conductor that is normally insulated from seawater. In the absence of noise, the voltage/current characteristic between the conductor at the location of the fault and a remote ideal ground contact (which may be a sea contact), is determined by the sum of a negligible contribution from resistance corresponding to current flowing in the sea far from the fault, plus a major contribution from resistance in the vicinity of the fault and at the contact between the water and the damaged cable. This voltage/current characteristic in the absence of noise is called the "voltage/current characteristic of the fault" and is non-linear because of the complex electrochemical phenomena involved. We use the term "fault electromotive force" for the voltage that appears in the absence of noise between the conductor at the location of the fault and a remote ideal ground contact and for zero current through the fault, said e.m.f. thus corresponding to the voltage/current characteristic of the fault for zero current.

At present, fault localization by measuring the DC resistance of the link is performed manually, either by using a resistance measurement bridge, or by making direct use of the voltmeters and ammeters installed on one or more PFEs connected to the ends of the link. Manual interpretation of measured resistances or values for voltage and current nevertheless gives rise to problems:

the measurements are complex to interpret manually because of the non-linearities of the repeaters or regenerators on links that include them, and, in this case, processing of the measurement data necessarily requires a set of data points on the current/voltage characteristic to be managed and used for each repeater or regenerator;

the non-linear voltage/current characteristic of a fault of unknown area must not interfere with locating the fault, and that can require the measurement data to be processed in complex manner and a measurement procedure that is difficult to perform;

the measurements are affected by noise from various causes; and a fault is located on the basis of data concerning the resistance per unit length of cable sections, and that requires a data set concerning the resistance per unit length of the cable sections to be managed and operated manually.

An object of the invention is to provide apparatus for locating faults in subsea links by measuring DC resistance, and enabling the above limitations to be overcome.

According to the invention, apparatus for locating faults on subsea telecommunications links, the apparatus being provided with two terminals, one for connection to one of the conductors of the subsea link and the other for connection to the sea or to ground, is characterized in that:

firstly it is capable of automatically delivering electrical power of at least 100 W to the subsea link in the form of regulated DC when the voltage/current characteristic of the link makes that possible;

secondly it is capable of absorbing electrical power of at least 1 W from the subsea link when the voltage/current characteristics thereof makes that possible;

thirdly it has one or more databases available concerning the resistances per unit length of cable sections, or one or more databases concerning the voltage/current characteristics of repeaters or of regenerators;

fourthly it is capable automatically on its own or together with another, identical apparatus, of performing measurements enabling a portion of the voltage/current characteristic at the end of the subsea link to which the apparatus is connected to be determined; and fifthly it is capable of automatically processing said portion of the voltage/current characteristic by making use of data from one or more databases to estimate the location of the fault by a processing that is capable of not being falsified by the voltage/current characteristic of the fault.

The apparatus of the invention can thus deliver DC to the link to take a reading of a portion of the voltage/current characteristic. For example, on subsea links that include repeaters or regenerators, the apparatus of the invention could thus be connected to the cable in the same way as the remote power feed is connected thereto. Given the noise voltage that may be as much as a few volts peak to peak at the end of a long link, it may be desirable to deliver a large amount of current to the subsea link so as to obtain a working voltage therefrom having the best possible signal-to-noise ratio. By way of example, the resistance of cable sections of a 1500 km optical fiber cable may be 0.97 $\Omega$/km, and the twelve regenerators may together have a resistance of 4314 $\Omega$ at 10 mA, 1268 $\Omega$ at 100 mA, and 268 $\Omega$ at 1.6 A which is the nominal operating current. Feeding the link with 1.6 A during measurement makes it possible to reduce the relative contribution of noise in the measured signal; however in this particular example, that would require a driving voltage of 2865 volts, and thus power of 4584 watts. Current regulation makes it possible to control the current flowing in the cable, in spite of fluctuating noise voltages. It may be observed that it is generally advantageous for apparatus of the invention to be capable of changing automatically the polarity of the current that it is applying, with this advantage appearing clearly from the description below.

It is also important for the apparatus of the invention to be capable of absorbing the electrical power that the subsea link may apply, so as to be capable under all circumstances of discharging the capacitance constituted by the cable, which is about 0.18 $\mu$F/km, or so as to be capable of discharging the electrochemical cell that appears because of the fault when the fault includes contact between a metal conductor of the cable and seawater. Discharging this electrochemical cell prior to performing certain measurements makes it possible to increase the accuracy of the measurements, in application of a technique that is well known to the person skilled in the art.

It may be observed that such discharge must not be performed through a short circuit since in that case a very large current might flow in the link, and such a current might lie outside the specifications of the repeaters or regenerators, and could thus destroy them. That is why the apparatus of the invention is designed to be capable of absorbing power from the subsea link.

By way of non-limiting example, a portion of the voltage/current characteristic of the end of the link to which the apparatus is connected can be determined by imposing one or more current reference levels over time, and by measuring one or more corresponding voltages over time.

Also, by way of non-limiting example, it is possible to envisage measuring voltage and current simultaneously over time. This second solution is naturally more expensive than the first, but it generally makes greater accuracy possible.

Methods enabling the resistances per unit length of the cable sections and the voltage/current characteristics of the regenerators or the repeaters to be taken into account on the basis of data concerning the cables or the repeaters or regenerators are well known to the person skilled in the art, and computer implementation thereof based on databases for the purpose of obtaining automatic processing can be achieved by methods that are known to the person skilled in the art of computing. For example, the databases used in apparatus of the invention may be designed so as to make it easy to input the parameters of a link, plus any subsequent modifications thereto, so as to be able to cater for changes that take place on a link, e.g. following repair.

Methods well known to the person skilled in the art, such as the two methods outlined above by way of non-limiting example and referred to us as "Schaefer's method" and as the "conjugate method" enable the fault to be located by processing that can avoid being falsified by the voltage/current characteristic of the fault. In order to discuss these methods, it is appropriate to classify the faults that are most commonly encountered. We use the term "type 1" fault for the cable being cut, with a break in the electrical insulation between seawater and a conductor of the cable that is normally insulated. This type of fault occurs, for example, if the above-described composite conductor is put into contact with the sea. This can happen, for example, when the cable is caught by a trawler and is then cut so as to release the vessel without losing its catch. The term "type 2" fault is used when the cable is cut but without breaking the electrical insulation between seawater and a normally insulated conductor of the cable. This type of fault is encountered, for example, if the break is the result of a cable being stretched so that the polyethylene covers the conductive portions in waterproof manner. We use the term "type 3" fault for a break in the insulation of a normally insulated conductor without the conductor itself being cut. Faults can exist that do not fall into the above types, but faults of types 1, 2, and 3 cover a large proportion of the cases encountered in practice.

The person skilled in the art of subsea links knows that the voltage/current characteristic of a fault is not only non-linear, but it also depends on the history of the fault. A fault which has been left inert for too long in seawater, or which has carried a large positive current for too long, i.e. which has allowed too great a charge to pass, will have difficulty in passing current because oxide deposits appear that conduct poorly. The person skilled in the art refers to such a fault being "plugged". When the fault has not been spoilt excessively, it is then possible to restore a voltage/current characteristic thereto close to that which it used to have before becoming plugged. This is done by applying a negative current to the fault (e.g. causing hydrogen to be given off by water being electrolyzed at the fault), thereby unplugging the fault, in a procedure that is known to the person skilled in the art. Apparatus of the invention can be designed so as to be capable of applying this type of procedure automatically.

Measurements for determining a portion of the voltage/current characteristic at the end of the subsea link to which the apparatus is connected suffer from electrical noise due to various causes including the telluric potential difference, well-known to the person skilled in the art, which generally plays a major role. This potential difference has a DC component, but it is also capable of varying rapidly.

The person skilled in the art uses the term "link electromotive force" to designate the voltage observed at zero current between one end of the cable and ground at said end. This link electromotive force is thus the sum of the electromotive force of a fault, of the telluric potential difference, and of the contribution from other sources of noise. By way of example, apparatus of the invention may locate a fault by processing capable of avoiding being falsified by the voltage/current characteristic of the fault, based on a fault model in which the voltage/current characteristic of the fault is modelled in a limited range of current values by a voltage such that the absolute value of its difference with the fault electromotive force is equal to the absolute value of the current raised to a negative power greater than minus one. We call such processing "Schaefer's method".

Schaefer's method is applied to type 1 and to type 3 faults, with a single apparatus of the invention being used for the measurements at an end A of the link. With type 3 faults, the method is applied when the portion of the subsea link on which the measurement is performed is not metallically connected to an electrical power supply other than the apparatus of the invention. Schaefer's method relies on the heuristic assumption whereby, at current densities per unit area at the fault that are sufficient but that do not exceed about 50 mA/cm2, the voltage/current characteristic of the fault once it has been discharged can be described by a relationship having the following form:

$$|V_D(I) - V_{DO}| = KI^{-\alpha} \qquad (1)$$

where $V_D(I)$ is the voltage which appears between the conductor at the location of the fault and an ideal ground connection remote therefrom and in the absence of noise, where $V_{DO}$ is the electromotive force of the fault, where I is the absolute value of the current flowing through the fault, where k is an unknown constant characteristic of the fault and of the current flow direction, and where $\alpha$ is a positive heuristic constant that is smaller than 1, generally being taken as equal to 1/1.3. Simple mathematical and operational methods known to the person skilled in the art make it possible on the basis of a plurality of points on the voltage/current characteristic as measured at the end A to eliminate the contribution of the voltage $V_D(I)$, such that in the absence of measurement noise there remains only the contribution due to the voltage drop along the portion of the link between the end A and the fault, thus solving the problem.

For example, such a method consists firstly in measuring the constant portion $V_{LA}$ of the electromotive force of the link at the end A, and secondly in observing that the voltage $V'_A$ obtained by decreasing the voltage $V_A$ measured between the conductor at the end A and earth, from the voltage VLA, is given by the following relationship, ignoring any possible contribution of a noise voltage of zero mean level, and any contribution of ground resistance at the end A:

$$V'_A = V_A - V_{LA} = V_D(I_A) + R_A I_A + V_{RA}(I_A) \qquad (2)$$

where $I_A$ is the current measured by the apparatus of the invention, $R_A$ is the resistance of cable sections from the end A to the fault, and $V_{RA}(I_A)$ is the voltage that results from the voltage/current characteristic of the set of repeaters or regenerators from the end A to the fault. By using (1), and introducing the following variable:

$$x = |I_A|^{-\alpha(1-\alpha)} \qquad (3)$$

the theoretical behavior of the fault leads to the following expression:

$$|V'_A - V_{RA}(I_A)/I_A| = kx + R_A \qquad (4)$$

from which the value of $R_A$ is deduced, thus making it possible to deduce the location of the fault on the basis of data concerning the resistance per unit length of cable sections. If $V_{RA}(I_A)$ is known, it is possible from (4) to deduce the value of $R_A$ from the ordinate at the origin of an affine function obtained by linear regression on the values of variables deduced from the measured data. In practice, it is possible for example to assume successively that the fault lies between different pairs of consecutive regenerators or repeaters, so as to formulate an assumption about $V_{RA}(I_A)$ relying on data from the database concerning the repeaters or regenerators, which makes it possible to solve (4) by an iterative process, well-known to the person skilled in the art of digital computation. In this way, the processing performed for location purposes is not falsified by the voltage/current characteristic of the fault.

To apply Schaefer's method, the portion of the voltage/current characteristic of the end of the link to which the apparatus is connected and as determined automatically by apparatus of the invention, can be restricted to three measurement points, including one at zero current. Nevertheless, localization will be of greater accuracy if use is made of more measurement points in the data processing algorithm, which can then take into account only those measurement points which satisfy the behavior described by (4), which would normally lead to points being rejected if they correspond to excessive current density per unit area or to insufficient current at the fault, since (1) is valid over a limited range only.

By way of example, apparatus of the invention can perform processing capable of not being falsified by the voltage/current characteristic of the fault by relying on measurements performed simultaneously with a second apparatus of the invention in such a manner that the current flowing through the fault is negligible under steady conditions during the measurements that are used for localization purposes. We call this the "conjugate method".

The conjugate method is applicable to type 3 faults. Both ends A and B of the subsea link must be used, with an apparatus of the invention being connected to each of them, the portion of the subsea link on which measurement is performed not being metallically connected to any electrical power supply other than the two apparatuses of the invention. The two apparatuses of the invention simultaneously apply same-direction current of practically the same value to both ends of the link. Conservation of current thus requires that the current flowing through the fault under steady conditions to be substantially zero, and thus that its potential relative to ground (or sea) to be practically zero. Ignoring any possible contribution from noise voltages having zero mean value, or from the ground resistance at the ends A and B, the voltage $V_A$ that appears at end A, and the voltage $V_B$ that appears at end B are thus given simply by the following:

$$R_A = \frac{V_A - V_{LA} - V_{RA}(I_A)}{I_A} \quad (5)$$

and $$R_B = \frac{V_{RB}(I_A) - V_B + V_{LB}}{I_A} \quad (6)$$

where the same notation is used as for Schaefer's method, where $R_B$ is the resistance of cable sections from end B to the fault, where $V_{LB}$ is the constant portion of the link electromotive force at end B, and where $V_{RB}(I_A)$ is the voltage that results from the voltage/current characteristic of the set of repeaters or regenerators from end B to the fault. If $V_{RA}(I_A)$ or $V_{RB}(I_A)$ is known, then the location of the fault can be deduced from the value of $R_A$ given by (5) or from the value $R_B$ given by (6). In practice, it is possible, for example, to assume in succession that the fault lies between different consecutive pairs of regenerators or repeaters so as to form an assumption concerning the value of $V_{RA}(I_A)$ or of $V_{RB}(I_A)$, based on the data about the repeaters or regenerators as made available in the corresponding databases, thus enabling (5) or (6) to be solved by an iterative process, well-known to the person skilled in the art of digital computation. In this way, processing performed for localization purposes on the basis of measurements performed simultaneously by two apparatuses of the invention is not falsified by the voltage/current characteristic of the fault.

For application of the conjugate method, the portion of the voltage/current characteristic for the end of the link to which the apparatus is connected, as determined automatically by the apparatus of the invention, can be limited to two measurement points including one for which the current is zero. Nevertheless, to apply this method it is essential for the currents imposed by the apparatuses of the invention at the ends A and B of the link to be applied simultaneously, since it is often advantageous to implement this method with large currents at the ends A and B and such currents run the risk of plugging the fault quickly if ever they are applied from one end only.

In a particular embodiment of apparatus of the invention, the apparatus includes a modem for the purpose of enabling automatic measurements to be performed jointly with another apparatus of the invention. The dialog performed by the two apparatuses of the invention via their respective modems make it possible to automate locating a fault by means of the conjugate method.

Fault localization by means of the conjugate method is generally more accurate than localization performed using Schaefer's method, but clearly it cannot be applied to faults of type 1.

By way of example, apparatus of the invention can implement fault localization by processing that is capable of not being falsified by the voltage/current characteristic of the fault, by relying on fault modelling that stems from theoretical results concerning electrochemistry. We call such a method of locating faults a "physical method".

A physical method may differ from Schaefer's method only with respect to the assumptions and the algorithms used for processing the data. It is relevant to observe that Schaefer's method has been used since the 19th century on telegraph cables and that the range over which an expression such as (1) is valid is necessarily very limited, particularly because of its flagrant incompatibility with modern results in electrochemistry. A physical method can, for example, take advantage of the fact that the person skilled in the art of electrochemistry is well aware that when electron transfer at an interface is for the most part kinetic transfer, then the contact potential at the fault can be expressed in the following form over one or more ranges of current values:

$$\frac{dV_D(I)}{d\mathrm{Log}I} = K \quad (7)$$

where $V_D(I)$ is the voltage that appears between the fault and the sea remote from the fault, where I is the absolute value of the current flowing through the fault, and where K is a constant characteristic of the fault and of the current direction, and unknown under the circumstances in which we are concerned. Simple mathematical methods known to the person skilled in the art can be used on the basis of a plurality of points on the voltage/current characteristic as measured at point A to eliminate the contribution of the voltage $V_D(I)$ such that, ignoring measurement noise having zero mean value, there remains only the contribution due to the voltage drop along the portion of the link that exists between the end A and the fault, thereby solving the problem.

Such a method can rely, for example, on transforming (7) as follows:

$$R_A(I_A - I_{A0}) + V_{RA}(I_A) - V_{RA}(I_{A0}) = V_A - V_{A0} + K\mathrm{Log}\frac{I_A}{I_{A0}} \quad (8)$$

where the same notation is used as before and in which $V_{AO}$ and $I_{AO}$ are a special pair of values for $V_A$ and $I_A$, where both pairs are taken from the range in which (7) is valid. By using a third particular pair of values for $V_A$ and $I_A$, a second equation similar to (8) can be written, and from which it is easy to eliminate the constant K, and knowing the value $V_{RA}(I_A)$ to extract the value of $R_A$ thus making it possible to deduce the location of the fault on the basis of data concerning the resistance per unit length of the cable sections. In practice, it may be necessary, for example, to assume successively that the fault lies between different pairs of regenerators or repeaters so as to formulate an assumption concerning $V_{RA}(I_A)$ and $V_{RA}(I_{AO})$, relying on the data in the database concerning the regenerators or repeaters, thus making it possible to solve by means of an iterative process, as is well-known to the person skilled in the art of digital computation. In this way, the processing performed for localization purposes is not falsified by the voltage/current characteristic of the fault.

Several variants of the physical method are possible, depending on which functions taken from electrochemical theory are selected for use, and each expression can have a different range of validity. The use of a physical method for locating faults on subsea cables generally provides an improvement over the use of existing methods such as Schaefer's method.

To apply a physical method, the portion of the voltage/current characteristic of the end of the link to which the apparatus is connected, as determined automatically by the apparatus of the invention, can be restricted to three measurement points only, or to some other minimum number of measurement points depending on the variant selected. Nevertheless, localization will be more accurate if more measurement points are used in the data processing algorithm, which can then ignore measurement points for which the behavior described by the assumed theoretical expression does not apply, which normally leads it to discard points that correspond to current density per unit area at the fault which is too high or too low, the range over which the usable theoretical expressions are valid generally being limited.

Apparatuses of the invention may be implemented in such a manner as to be capable of taking account of the assumed temperature of the sea surrounding the link, in order to make corrections in the resistance per unit length of the cable sections or in the voltage/current characteristic of the regenerators as a function of the assumed temperature. The assumed temperature may vary along the length of the link. This temperature may also depend on time of year, or time of day at which measurement is performed.

The voltages measured by apparatus of the invention are the result not only of the injected current value and the characteristics of the link and of the fault, but also of a noise voltage that may be caused by phenomena of natural origin or by artificial phenomena. Apparatus of the invention can thus be provided with analog or digital filters serving to filter out at least some of the noise affecting the measurements. By way of non-limiting example, it is possible, for example, to provide an analog lowpass filter having a cutoff frequency of 2 Hz, and after sampling the measured data, a digital lowpass filter having a cutoff frequency that is adaptable as a function of the noise level and of the desired response time, which can be implemented by methods that are well-known to the person skilled in the art, and that provide suitable averaging over a plurality of sampled measurements.

Apparatus of the invention may include a circuit breaker capable of interrupting the current if the value thereof exceeds values that can be accepted by the subsea link. The threshold values at which circuit breaking takes place may be different for negative currents and for positive currents. Links including regenerators or repeaters can be damaged by excessive current. By way of example, an optical fiber subsea link may be specified with a maximum current in the forward direction of 1700 mA and with a maximum current in the reverse direction of 200 mA, while its nominal operating current (in the forward direction) is 1600 mA. Excessive currents exceeding the value acceptable to the link may be produced, for example, in the event of failure in current regulation by apparatus of the invention.

Apparatus of the invention may be made in such a manner as to make it possible under all circumstances to guarantee the safety of personnel in spite of surges that may occur on the subsea link. Such surges can happen, in particular, when fault locating is performed on a branch of the link that is normally disconnected from the remainder of the link and when an untimely switchover of a branching unit takes place, which can lead to surges of about 10 kV. Persons skilled in the art of electronics know techniques that make it possible to ensure the safety of personnel in the event of such surges, one such technique possibly including galvanic isolation by means of one or more optical fibers between the various portions of the apparatus of the invention.

Apparatus of the invention can naturally locate a fault by means of its curvilinear abscissa along the sub-sea link, since localization makes use of the resistance per unit length of the sections of the link. Apparatus of the invention can also include a database concerning the geographical position of the link, and can deduce from this information the geographical location of the fault, e.g. by giving its latitude and longitude.

Apparatus of the invention may also be designed so as to make it possible to locate faults that include a break in a conductor, the conductor remaining insulated from the sea, by determining the capacitance of said conductor relative to the sea, and by using a database concerning the capacitance per unit length of the cable sections. This thus constitutes localization referred to above as concerning a type 1 fault. The capacitance between the conductor and the sea can be determined, for example, by means of apparatus of the invention injecting a current into said conductor after it has been discharged, and by processing the way in which the voltages measured on said conductor vary over time.

Other advantages and characteristics appear from the following description of a particular embodiment and implementation of the invention given by way of non-limiting example and as shown in FIG. 1. Apparatus of the invention (9) comprises a power supply and measurement rack module (3) capable of delivering up to 1.6 A at 3.1 kV, and of measuring voltages and current with accuracy better than 10–4, an intermediate unit (4), a computer link (7) compliant with standard CEI 625, a controlling computer (5) capable of monitoring a CEI 625 bus, an optical link (6) having two optical fibers, and a modem (8). A particular function of the intermediate unit (4) is to transform dialog with the computer link (7) where information travels in the form of electrical signals into dialog over the optical link where information travels in the form of optical signals, using any of the methods that are well-known to the person skilled in the art. The presence of an optical link of length exceeding one meter provides full galvanic isolation between the power supply and measurement rack module (3) and the controlling computer (5), thereby guaranteeing safety of the operator in the event of an incident on the measured subsea link. The role of the controlling computer (5) is to automate localization, and to provide dialog with the operator. The apparatus of the invention (9) injects DC into the conductor of the cable (1) on which there exists a type 1 fault, such that all of the injected current flows through the fault (2) and returns via the ground circuit. In this method of use, measurement can be processed either using Schaefer's method or using a physical method. The modem (8) is not used in this particular method of use.

Figure 2:
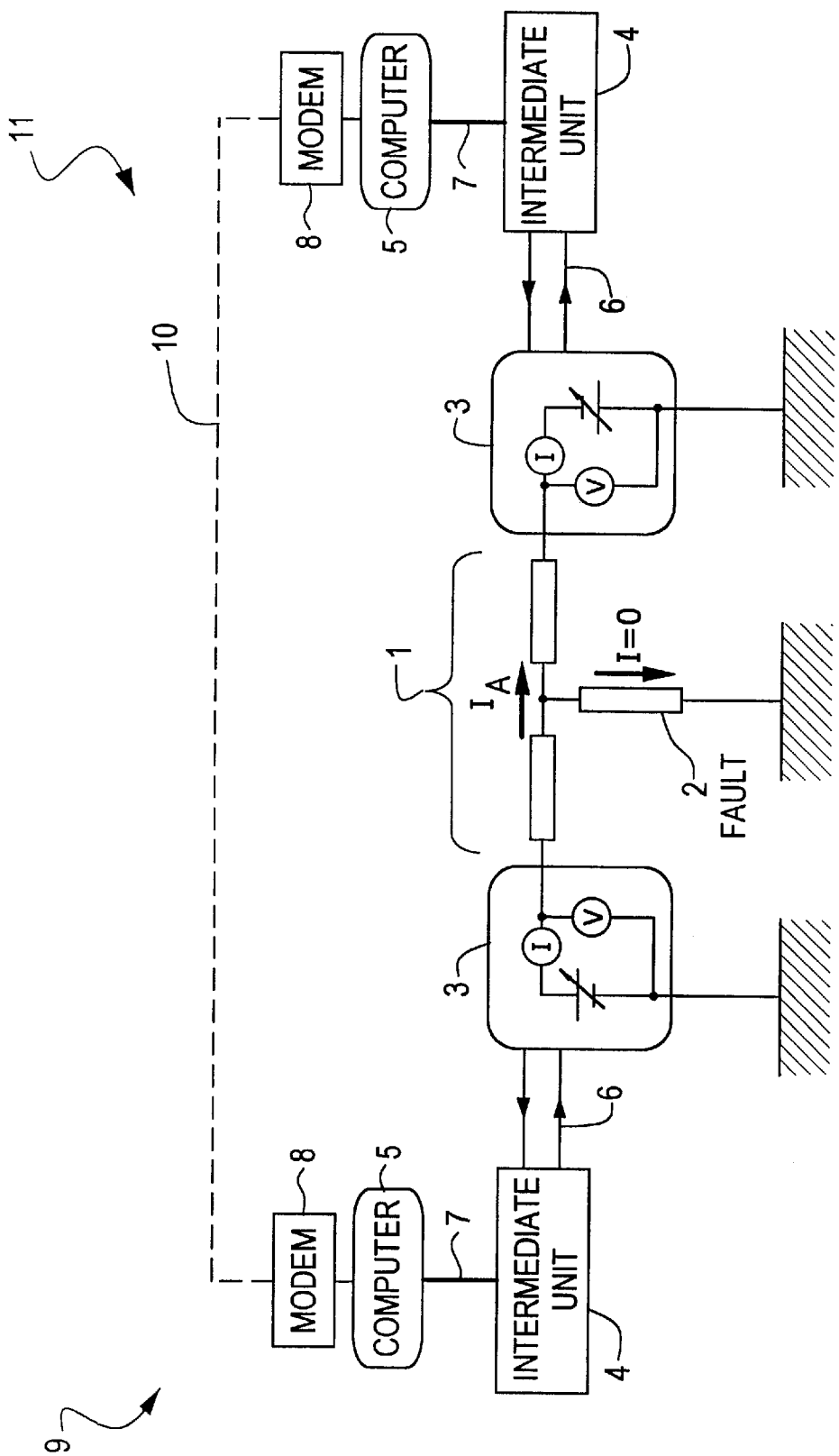

FIG. 2 shows a second particular method of using apparatus of the invention, given by way of non-limiting example. References (1) and (2) are used as before to designate the subsea link and its fault, with this fault being a type 3 fault, and references (3) to (8) designate the same functional units as before, belonging to a first apparatus of the invention (9). In this particular method of use, a telephone link (10) connects the first apparatus of the invention (9) to a second apparatus of the invention (11) which is identical to the first, the link passing via the modem provided in each of the apparatuses (9) and (11). The apparatus (9) connected to an end A of the subsea link and the apparatus (11) connected to an end B thereof, both deliver a current IA to the link, with current being taken as being positive in the direction of the horizontal arrow. The current through the fault is thus zero. The voltages relative to ground delivered by the power supply and measurement rack modules of the apparatuses (9) and (11) are of opposite signs, and each of them is characteristic of the voltage/current characteristic of the portion of the link that exists between the measurement point under consideration and the fault. The telephone link (10) enables the controlling computer in each of the apparatuses (9) and (11) to implement measurements and reference values synchronously in the power supply and measurement rack modules, and to perform localization automatically by using the conjugate method.

Figure 3:
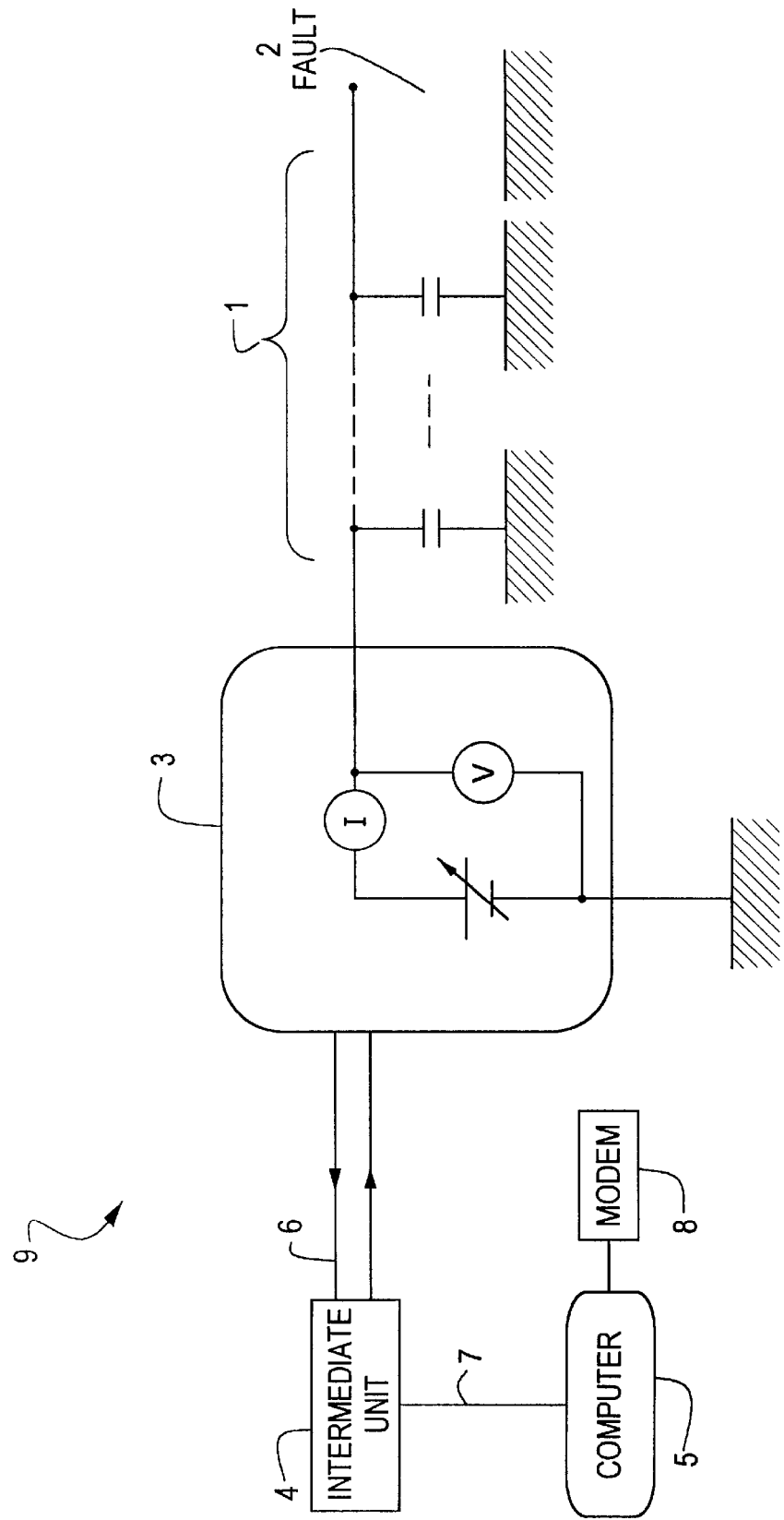

FIG. 3 shows a third particular method of using apparatus of the invention, given by way of non-limiting example. As before, references (1) and (2) designate the subsea link and its fault, which in this case is a type 2 fault, and references (3) to (8) designate the same functional units as before in apparatus of the invention (9). Since the fault is a type 2 fault, the link behaves like a capacitor. In this particular method of use, the power supply and measurement rack module delivers a constant current, e.g. 10 mA, and acquires the voltage applied to the subsea link every 100 ms. The way this voltage varies over time is characteristic of the capacitance of the link between the measurement point and the fault.

Apparatus of the invention is thus capable of locating faults that occur in subsea links automatically, accurately and quickly.

Apparatus of the invention can be supplied in particular to locating faults on subsea links implemented with optical fiber cables or with coaxial cables.

We claim:

1. Apparatus for estimating locations of faults on a subsea telecommunications link, said link comprising a cable comprising at least one electrical conductor and including repeaters or regenerators subdividing said cable into sections, the apparatus comprising:

two terminals, one for connection to said conductor and the other for connection to the sea or to ground;

means, connected to said conductor, for automatically delivering regulated DC to said conductor with electrical power of at least 100 W;

means, connected to said conductor, for absorbing an electrical power of at least 1 W which can be generated by the subsea link;

one or more databases containing data concerning the resistances per unit length of the conductor of the cable sections, or concerning the voltage/current characteristics of repeaters or of regenerators;

means, connected to said conductor, for automatically performing measurements, individually or in communication with another, identical apparatus, to determine a portion of the voltage/current characteristic at an end of the subsea link; and means, in communication with said means for performing measurements and said one or more databases, for automatically processing said portion of the voltage/current characteristic by making use of data from said one or more databases to estimate the location of the fault by said processing, free from falsification by the voltage/current characteristic of the fault.

2. Apparatus according to claim 1, further comprising means for imposing one or more reference currents over time to said conductor, and for measuring one or more corresponding voltages over time at said two terminals.

3. Apparatus according to claim 1, further comprising means for simultaneously measuring the voltage and the current over time at said two terminals.

4. Apparatus according to claim 1, wherein the means for automatically processing further comprises means for relying on a fault model in which the voltage/current characteristic of the fault is modelled, in a limited range of current values, by a voltage for which the absolute value of the difference between the voltage and the electromotive force of the fault is proportional to the absolute value of the current raised to a power lying in the range minus one to zero.

5. Apparatus according to claim 1, wherein the means for automatically processing further comprises means for making use of measurements performed in co-operation with an identical second apparatus so that the current flowing through the fault is negligible under steady conditions while measurements are being performed for use in locating a fault.

6. Apparatus according to claim 1, wherein the means for automatically processing further comprises means for using a model of the fault that stems from theoretical results from electrochemistry.

7. Apparatus according to claim 1, further including a modem, in communication with the means for automatically processing, for the purpose of enabling measurements to be performed with another, identical apparatus.

8. Apparatus according to claim 1, further comprising means, in communication with the means for automatically processing, for taking into account a given temperature of the sea surrounding the link, to correct the resistance per unit length of the cable sections or the voltage/current characteristic of the regenerators as a function of said given temperature.

9. Apparatus according to claim 1, further comprising analog or digital filters operative to filter out a certain portion of the noise to which the measurements are subject.

10. Apparatus according to claim 1, further comprising means for protecting against surges that may occur on the subsea link.

11. Apparatus for locating a fault on a subsea telecommunications link, said subsea telecommunications link comprising a cable and at least one signal enhancing device of one of repeater means and regenerator means; said cable comprising at least one electrical conductor; said at least one signal enhancing device subdividing said cable into sections; said apparatus comprising:

two terminals, one for connection to said conductor at an end of said subsea link, and the other for connection to one of the sea ground and ground;

means for automatically determining a portion of the voltage/current characteristic of said end of said subsea link;

at least one database containing first data concerning the resistances per unit length of said cable sections, and second data concerning the voltage/current characteristic(s) of said at least one signal enhancing device; and processing means for determining the location of said fault based on said portion of voltage/current characteristic and said first and second data.

12. Apparatus according to claim 11, further comprising means for absorbing an electrical power of at least 1 W which can be generated by said subsea link.

13. Apparatus according to claim 11, wherein said means for automatically determining a portion of the voltage/current characteristic of said end of said subsea link comprises:

means for delivering regulated DC current conductor of said subsea link; and means for measuring a voltage at said end of said subsea link.

14. Apparatus according to claim 13, wherein said means for delivering regulated DC current delivers regulated DC with electrical power of at least 100 W to said conductor of said subsea link.

15. Apparatus according to claim 13, wherein said means for delivering regulated DC current delivers one or more reference currents to said conductor over time, and said means for measuring a voltage at said end of said subsea link measures one or more voltages corresponding to said reference currents at said end of said subsea link over time.

16. Apparatus according to claim 13, wherein said apparatus co-operates with a second identical apparatus connected to a second end of said subsea link in such a manner that the current flowing through the fault is negligible under steady conditions.

17. Apparatus according to claim 14, wherein said means for automatically determining a portion of the voltage/current characteristic of said end of said subsea link measures a current and a voltage at said end of said subsea link simultaneously over time.

18. Apparatus according to claim 11, wherein said processing means determines the location of said fault using a fault model according to which the absolute value of the difference between the voltage appearing between said conductor near the fault and an ideal ground connection and an electromotive force of the fault is proportional to the absolute value of the current flowing through the fault raised to a power lying in the range minus one to zero.

19. Apparatus according to claim 11, wherein said processing means determines the location of said fault using a fault model that stems from theoretical results from electrochemistry.

20. Apparatus according to claim 11, including a modem for enabling said apparatus to dialog with another identical apparatus.

21. Apparatus according to claim 11, further comprising means for taking into account a given temperature of the sea surrounding said subsea link to correct the resistances per unit length of the cable sections as a function of said given temperature.

22. Apparatus according to claim 11, further comprising means for taking into account a given temperature of the sea surrounding said subsea link to correct the voltage/current characteristic(s) of said at least one enhancing device as a function of said given temperature.

23. Apparatus according to claim 11, further comprising filters for filtering out a certain portion of the noise to which the determination of said portion of the voltage/current characteristic of said end of said subsea link is subject when said means for automatically determining is in use.

24. Apparatus according to claim 11, further comprising means for protecting operators of said apparatus against surges that may occur on the subsea link.

* * * * *